(12) United States Patent
Jain

(10) Patent No.: US 8,791,602 B2
(45) Date of Patent: Jul. 29, 2014

(54) SYSTEM AND METHOD FOR CONTROLLING A SOLAR PANEL OUTPUT

(75) Inventor: Babu Jain, Cupertino, CA (US)

(73) Assignee: NavSemi Energy Private Ltd., Singapore (SG)

( * ) Notice: Subject to any disclaimer, the term of this patent is extended or adjusted under 35 U.S.C. 154(b) by 1001 days.

(21) Appl. No.: 12/857,980

(22) Filed: Aug. 17, 2010

(65) Prior Publication Data
US 2011/0036344 A1    Feb. 17, 2011

Related U.S. Application Data

(60) Provisional application No. 61/234,540, filed on Aug. 17, 2009.

(51) Int. Cl.
*F24J 2/38*    (2014.01)
(52) U.S. Cl.
USPC .......................................... 307/117; 307/151
(58) Field of Classification Search
USPC .................................................. 307/117, 151
See application file for complete search history.

(56) References Cited

U.S. PATENT DOCUMENTS

| | | | |
|---|---|---|---|
| 4,086,485 A | 4/1978 | Kaplow et al. | |
| 4,333,136 A | 6/1982 | Baker | |
| 6,255,804 B1 * | 7/2001 | Herniter et al. | 320/137 |
| 6,433,522 B1 | 8/2002 | Siri | |
| 6,690,590 B2 | 2/2004 | Stamenic et al. | |
| 7,158,395 B2 * | 1/2007 | Deng et al. | 363/95 |
| 7,709,727 B2 | 5/2010 | Rohrig et al. | |
| 7,864,497 B2 | 1/2011 | Quardt et al. | |
| 2001/0043050 A1 | 11/2001 | Fisher, Jr. | |
| 2004/0207366 A1 | 10/2004 | Sung | |
| 2006/0017327 A1 | 1/2006 | Siri et al. | |
| 2006/0185727 A1 | 8/2006 | Matan | |
| 2008/0164766 A1 | 7/2008 | Adest et al. | |
| 2008/0238195 A1 | 10/2008 | Shaver et al. | |
| 2009/0078300 A1 | 3/2009 | Ang et al. | |
| 2010/0052425 A1 * | 3/2010 | Moore et al. | 307/52 |

FOREIGN PATENT DOCUMENTS

| | | | |
|---|---|---|---|
| EP | 2 056 180 A1 | 5/2009 | |
| JP | 08-191573 A | 7/1996 | |
| WO | WO 95/33283 A1 | 12/1995 | |
| WO | WO 2006/005125 A1 | 1/2006 | |

OTHER PUBLICATIONS

Machine translation of the description and claims of WO 95/33283.*

(Continued)

*Primary Examiner* — Fritz M Fleming
(74) *Attorney, Agent, or Firm* — Mahamedi Paradice LLP

(57) ABSTRACT

A control system includes a control module and one or more input sources. The control module is coupled to an output of the solar module in order to operate the solar panel so that an output of the solar panel is at a maximum power level. The control module is able to selectively decrease a current level of the solar panel's output in response to a condition that is indicative of a temperature of the solar panel while maintaining the power output of the solar panel at or within a designated percentage of the maximum level. The input source is coupled to the control module to provide an input that is indicative of the temperature.

15 Claims, 3 Drawing Sheets

(56) References Cited

OTHER PUBLICATIONS

International Preliminary Report on Patentability as issued in corresponding international application PCT/US2010/045737, dated Mar. 1, 2012.
International Search Report and Written Opinion issued in corresponding International Application No. PCT/US/2009/068946, dated Aug. 13, 2010.
International Search Report and Written Opinion issued in corresponding International Application No. PCT/US/2011/034217, dated Jan. 13, 2012.
International Search Report, Written Opinion and Notice of Transmittal of same mailed Mar. 24, 2011 in International Application No. PCT/US10/045737.
Non-Final Office Action for U.S. Appl. No. 12/643,266, dated Jul. 18, 2013.

* cited by examiner

SYSTEM AND METHOD FOR CONTROLLING A SOLAR PANEL OUTPUT

RELATED APPLICATIONS

This application claims benefit of priority to Provisional U.S. patent application No. 61/234,540, filed Aug. 17, 2009; the aforementioned priority application being hereby incorporated by reference in its entirety.

TECHNICAL FIELD

The disclosed embodiments relate to a system and method for controlling a solar panel output.

BACKGROUND

A solar panel's operating point (voltage and current) is decided by an electronic circuit called a maximum power point tracker ("MPPT"). As the temperature increases, the MPPT drifts to produce a lower energy output. The $V_{OC}$, or open circuit voltage, reduces significantly and $I_{SC}$, or short circuit current, increases marginally.

FIG. 5 is a circuit equivalent of a conventional solar cell. $R_{SH}$ represents the junction resistance of the cell.

Currently, MPPT based solar systems do not provide for temperature compensation. Thus, when panel temperature increases, the $V_{OC}$ drops, and the panel works at new $V_{MPP}$ and $I_{MPP}$ values. There is no correction provided for reducing panel stress.

DETAILED DESCRIPTION

Figure 1:
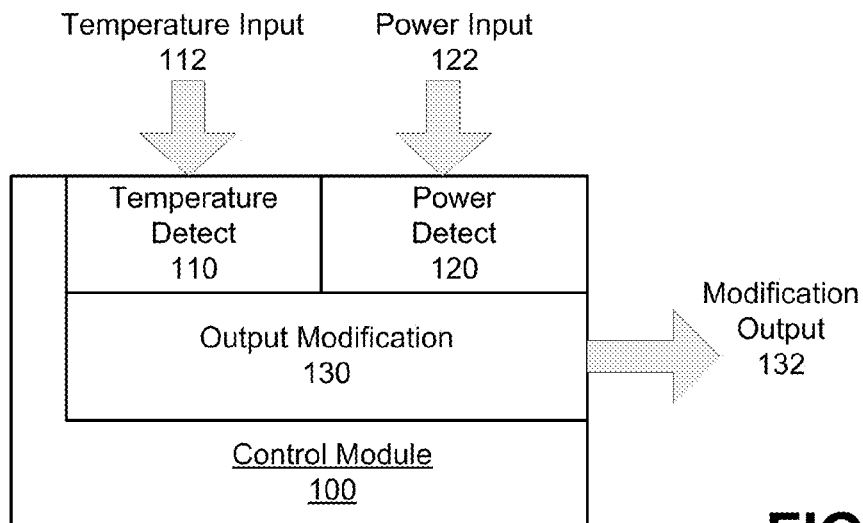
FIG. 1 illustrates a control module for use in controlling an output of a solar panel, according to an embodiment.

According to embodiments, a control system or module is provided to provide temperature compensation that offsets the impact of increased temperature when a solar panel is in operation. Embodiments such as described enable output from the solar panel to be maximized, while enabling beneficial reduction in the temperature of the solar panel. Among other benefits, the longevity of the solar panel can be increased by decreasing the temperature of the solar panel when it is operating at high temperatures.

More specifically, embodiments recognize that when the temperature of a solar cell increases, it causes an increase in the junction resistance. This is because mobility of the charge carriers is inversely proportional to temperature. As the temperature rises, there is increased carrier scattering on lattice vibrations (phonons) and impurities. This decrease in mobility causes a decrease in the conductivity and an increase in the series resistance.

Embodiments recognize that an increase in the temperature of a solar cell also results in a slight increase in the short circuit current. The short circuit current from a solar cell is the photocurrent. As the temperature increases, the bandgap decreases, and as a result, photons of a lower wavelength (lower energy) are absorbed by the solar cell, which results in a slight increase in photocurrent. It is believed that due to the increase in temperature, series resistance increases, which impacts the current downwards. However, due to increase in temperature, photons with lower wavelengths are absorbed by the solar cell which causes the current to go higher. As a net effect, current increases marginally with an increase in temperature. Furthermore, the bandgap decreases with increasing temperature, more electrons are able to move into the conduction band. The extra electrons in the conduction band and the holes in the valence band lead to an increase in the dark current. An increase in the dark current results in a decrease in the open circuit voltage.

Furthermore, embodiments described herein recognize that heat dissipation is a contributor to panel aging. As such, embodiments as described can be implemented to lower heat dissipation, and thus increase panel life at a relatively lower power output.

In particular, the operating temperature of the solar panels can be lowered without impacting energy harvesting from solar panels, systems, modules, cells or devices. A slight reduction in current helps reduce the power dissipation, and thus helps lower the panel temperature. Such a slight reduction in current will increase the voltage and result in the power output to be almost the same.

Embodiments described herein include a control system for a solar panel. The control system includes a control module and one or more input sources. The control module is coupled to an output of the solar module in order to operate the solar panel so that an output of the solar panel is at a maximum power level. The control module is able to selectively decrease a current level of the solar panel's output in response to a condition that is indicative of a temperature of the solar panel while maintaining the power output of the solar panel at or within a designated percentage of the maximum level. The input source is coupled to the control module to provide an input that is indicative of the temperature.

According to some embodiments, by reducing currents drawn from a module, cell or device, the open circuit voltage ("$V_{OC}$") can be increased to a higher voltage. As $V_{OC}$ increases, the maximum power point ("MPP") voltage also increases, and thus, leads to a decrease in power loss. Furthermore, in some embodiments, temperature compensation can reduce the current, which is expected to reduce the temperature slightly (due to the lower loss in $R_S$ (series resistance of the solar cells) and $R_{SH}$ (shunt resistance of the solar cells)).

Still further, embodiments described herein can generate maximum energy from solar panels at significantly reduced stress levels. Reducing the stress levels of the solar panels can help increase the operating life of solar panels.

FIG. 1 illustrates a control module for use in controlling an output of a solar panel, according to an embodiment. In FIG. 1, a control module 100 is shown for modifying an output of a solar panel so as to reduce current output and the operating temperature of the solar panel. The control module 100 includes temperature detection logic 110, power detection logic 120, and output modification logic 130. The control module 100 controls the output of a solar panel by affecting current levels on the solar panels output. More specifically, as described with FIG. 2 and elsewhere, the control module 100 is operable to reduce current levels on the solar panel's output (so as to reduce temperature levels of the solar panel), while maintaining a power level of the solar panel at or near a maximum level.

The temperature detection logic 110 uses temperature input 112 from the solar panel (see FIG. 3) to determine the temperature level of the solar panel. The power detection logic 120 uses sensors (see FIG. 3) on the output lines of the solar panel to determine voltage and current levels.

The output modification logic 130 is coupled to hardware or other resources for affecting current levels on the output of the solar panel. As described with one or more other embodiments, the control modification logic 130 can affect a switching element of the solar panel output, in order to increase or decrease the current levels of the solar panel output.

Accordingly, the output modification logic 130 provides a modification output 132 that controls the hardware or resource for reducing the current level of the solar panel output.

Figure 2:
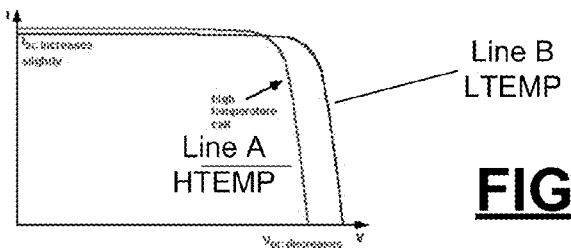
FIG. 2 illustrates the output of a solar panel in view of temperature changes.

FIG. 2 illustrates the output of a solar panel in view of temperature changes. The output of the solar panel may be described in terms of (i) an open circuit voltage ($V_{OC}$), and (ii) a short circuit current ($I_{SC}$). The product of the open circuit voltage and the short circuit current is the power level of the solar panel's output. The maximum power point ("MPP"), or maximum power level, occurs at about the point of inflection in each of the power graphs shown.

As shown by FIG. 2, the output of the solar panel can change as a result of temperature increase in the solar panel. In particular, the current ($I_{SC}$) increases slightly if there is an increase in temperature, and the voltage $V_{OC}$ drops significantly. Embodiments recognize that as the temperature changes, the MPP moves inwards or outwards depending on the respective increase or decrease in temperature. In general, MPP moves inward when the temperature increases (see graph line A at high temperature and graph line B at less). This is due to the fact that with the increase in temperature, $V_{OC}$ decreases while $I_{SC}$ stays relatively unchanged (or can increases slightly).

There are several methods to track the MPP. These methods are known as MPP tracking (or MPPT). In one embodiment, the temperature is monitored using temperature sensors such as a thermistor, using semiconductors or using any other method.

With reference to FIG. 2, control module 100 can be implemented to force current reduction (i.e. reduce $I_{MPP}$) in the output of the solar panel. The reduction in current, when appropriately measured, results in an increase of the solar panel's output voltage (i.e. increase $V_{MPP}$). Additionally, the reduction in current reduces the temperature of the panel, thus enhancing longevity of the solar panel. According to some embodiments, the forced reduction in current may be implemented along with MPPT, so that the forced current reduction is iterative and optimized to sustain power levels at or near maximum.

Figure 3:
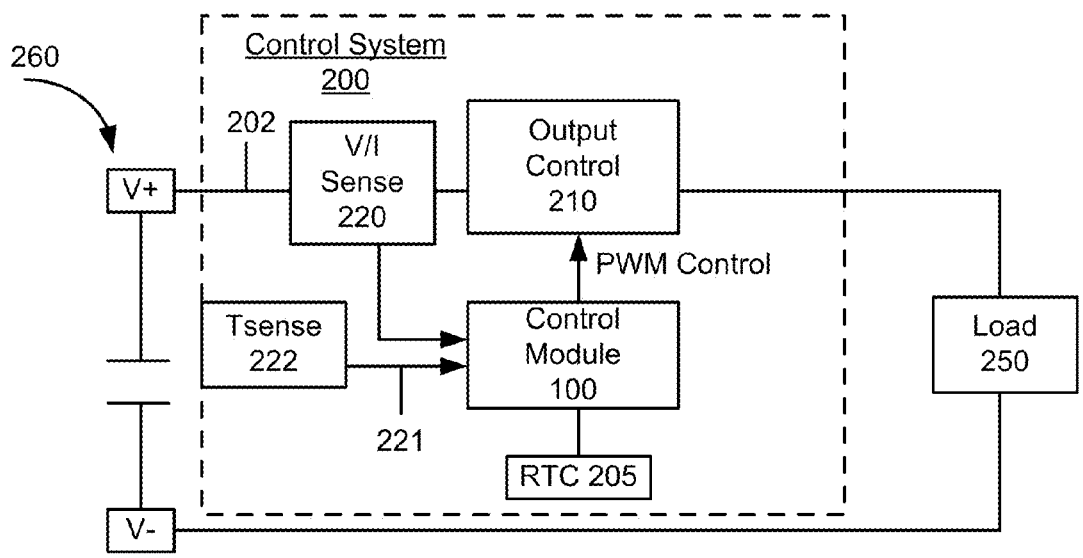
FIG. 3 illustrates a control system for controlling an output of a solar panel, according to embodiments.

FIG. 3 illustrates a control system for controlling an output of a solar panel, according to embodiments. A system 200 includes a control module such as described with an embodiment of FIG. 1. Accordingly, system 200 is coupled to affect current levels on an output line 202 of a solar panel 260. The system 200 includes control module 100, output control element 210, and one or more detectors 220 for detecting voltage and current on the output lines of the solar panel. Additionally, system 200 may include a temperature sensor 222 which detects a temperature of the solar panel during its operation.

The control module 100 may be implemented by a processor or integrated circuit device. The control module 100 receives a temperature input 221 from the sensor 222. In addition, the control module 100 receives input that indicates the voltage and current levels of the output line 202. The output modification logic 130 (see FIG. 1) of the control module 100 implements a process to use the inputs from the temperature sensor 222 and the voltage/current detectors 220. The algorithm implemented by the control module 100 results in the output control 210 reducing the current level on the output line 202. In one embodiment, the algorithm of the control module 100 implements MPPT with adjustment to current levels based on temperature input.

According to some embodiments, the output control 210 is a switching element. In particular, one a more embodiments provide that the output control 210 is a buck-boost switching element, capable of bucking or boosting the output voltage (i.e. Voc) on the output line 202. In one implementation, the switching element is formed by a combination of MOSFETs or other transistors. The gate of the MOSFETs is controlled by pulse width modulation from the control module 100. The control module 100 reduces the current level on the output line 202 by changing the switching speed of the switching element. In this regard, the control module 100 may signal a pulse width modulus (PWM) control signal to affect the operation of the switching elements in reducing the current levels (or conversely, increasing the current levels) based on the requirements of the algorithm and/or other conditions.

Figure 4:
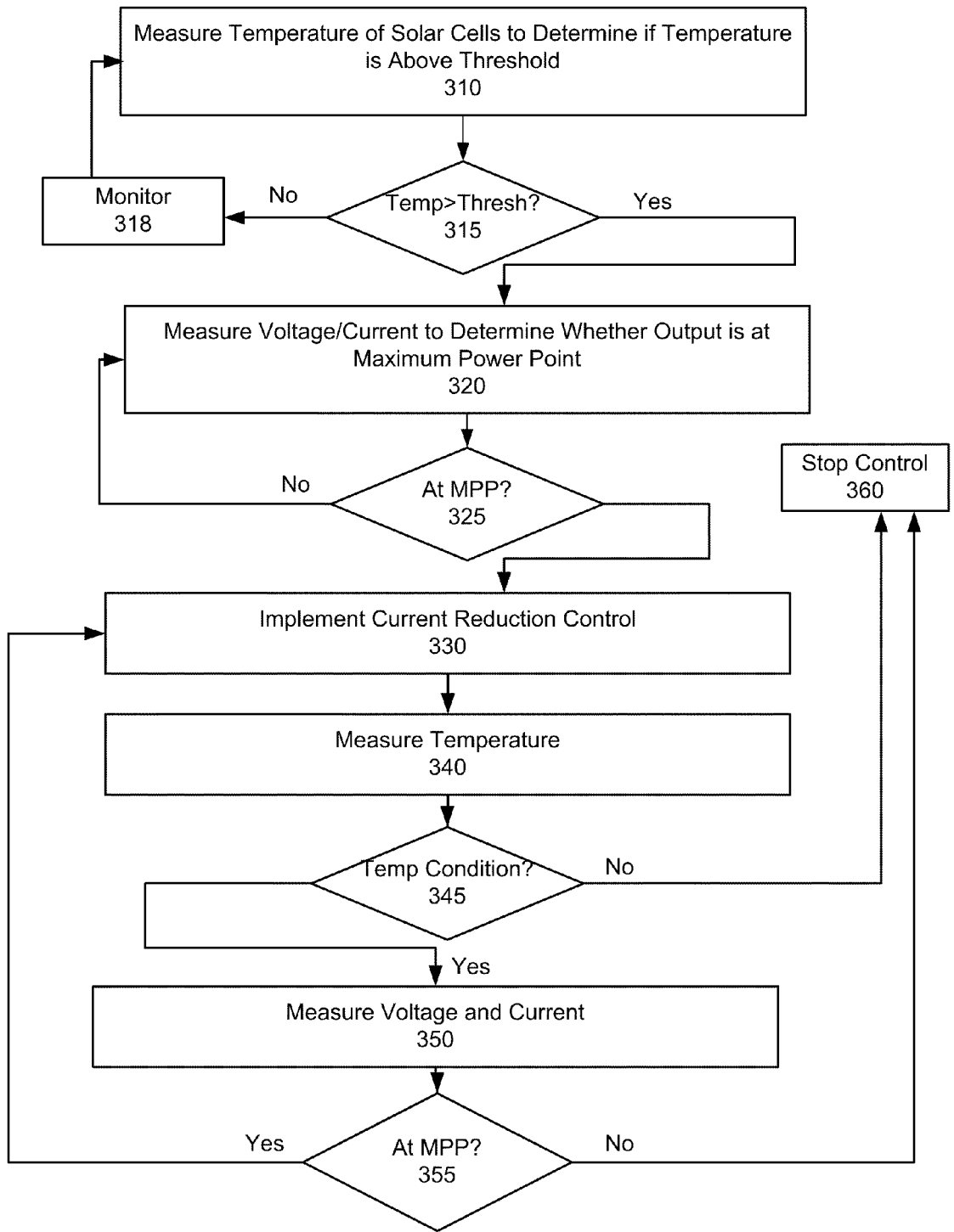
FIG. 4 illustrates a process for controlling an output of a solar panel, according to embodiments described herein.
Figure 5:
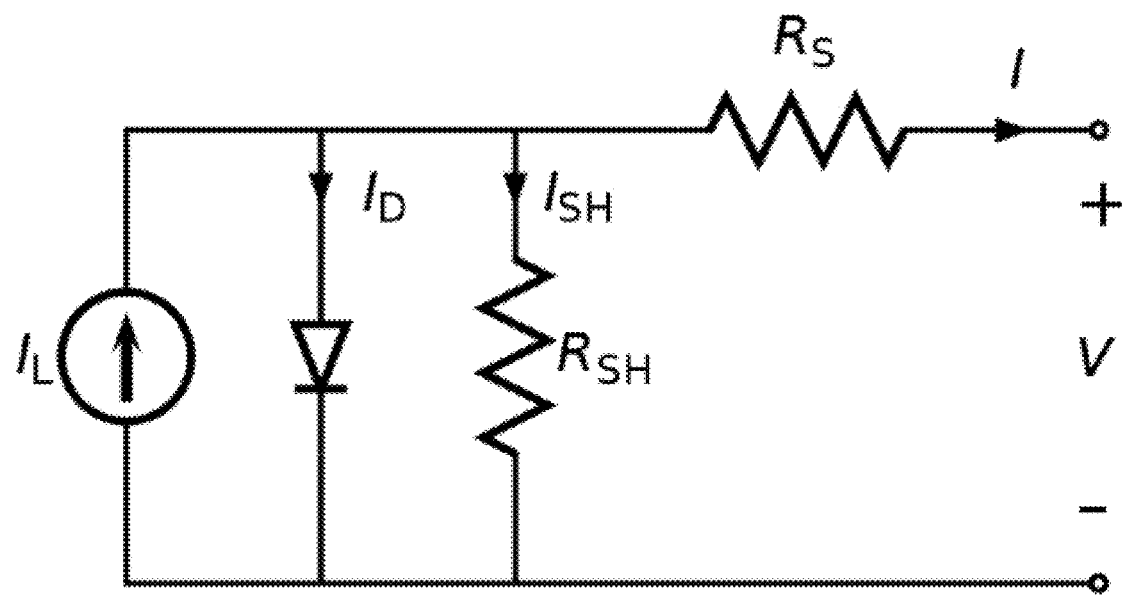
FIG. 5 is a circuit equivalent of a conventional solar cell. $R_{SH}$ represents the junction resistance of the cell.

FIG. 4 illustrates a process for controlling an output of a solar panel, according to embodiments described herein. A method such as described by FIG. 4 can be implemented using a system of FIG. 3. Accordingly, reference is made to elements of FIG. 3 for purpose of illustrating suitable components or elements for performing a step or sub-step being described.

According to an embodiment, the determination as to whether current reduction (and temperature reduction) is to take place is predicated on triggering conditions being present. In an embodiment, the triggering conditions include (i) temperature precondition, and (ii) power output precondition. In one embodiment, the temperature of the solar panel is identified (310) in order to determine whether the solar panel temperature is above a threshold temperature (315). In general, the temperature of the solar panel can increase or decrease due to two main factors: (1) environmental factors decided by nature, and (2) heat produced due to the current through the series ($R_S$) and shunt ($R_{SH}$) resistors of the panel and cables. If the temperature is not above the threshold, the current reduction is not implemented, but further temperature monitoring may take place (318) until the temperature condition (e.g. temp>threshold) is present.

Current reduction modification may be implemented as a means to reduce temperature on the solar panel. As such, such modification may be avoided when the temperature of the solar panel is less than a threshold temperature. In such cases, the temperature of the solar panel may be repeatedly monitored (318) to determine if the condition occurs in which the temperature of the solar panel is above the temperature threshold.

If the temperature condition is present (e.g. the solar panel temperature is above the threshold), then an embodiment provides for determining the power level of the output 202 from the solar panel (320). As such, the current and voltage of the output 202 is detected. A determination is made as to whether the output of the solar panel is at (or within a designated percentage of) a maximum power level (325). The maximum power level may be determined from logic or data residing with the control module 100. An MPPT algorithm may be performed, for example, as part of steps 320 and 325 to achieve MPP. In one embodiment, the control module 100 uses pulse width modulation to control switching parameters of a switching element (e.g. MOSFET) used to control voltage and current on the output line 202 of the solar panel. The PWM parameters can be selected by an MPPT algorithm based on the input parameters (such as panel current and panel voltage provided by the sensors shown in FIG. 3). The sensing is performed at a fixed interval determined by the PWM frequency. The product of sensed voltage and current, which is instant power, is compared to a previous value. If the new instant power is higher than the previous value, the PWM width is increased, thus increasing the current value. This process is continued until the new instant value of power is lower than previous value. This point is known as the MPP and the PWM width is fixed at this level.

According to embodiments, current reduction modification of the solar panel output is possible only when the power level of the output is at or within a designated percentage of the maximum power level. The designated or threshold percentage of the maximum power level may be set in part by design parameters. For example, current reduction modification may take place when the power level of the output is at or within 95% (or alternatively 99%) of the maximum power level. Other acceptable ranges (e.g. 90%) may also be used.

If triggering condition are present corresponding to (i) the power level of the solar panel being at a maximum (i.e. operating at MPP), and (ii) the temperature of the solar panel being above a threshold, then the control module 100 implements current reduction control (330). In one embodiment, control module 100 changes the switching speed of the control element 210 coupled to the output 202 of the solar panel in order to reduce current levels of the output. Still further, a temperature compensation circuit may be used to force the current to be lower than its MPP value by controlling the PWM. As a result, lower current runs through the series ($R_S$) and shunt ($R_{SH}$) resistors, thereby producing less power dissipation. The reduction in current is accompanied by a corresponding increase in voltage, so that almost the same amount of power is supplied from the solar panel. This new MPP is temperature compensated using the approach described above. In typical situations, the new MPP will be higher than the non-compensated $V_{MPP}$ and lower than non-compensated current at MPP ($I_{MPP}$).

Once current reduction takes place, one embodiment provides that the control module 100 determines the temperature of the solar panel using input from the temperature sensor 222 (340). The temperature condition, or new condition, may be checked as part of the solar panel's response to the current reduction (345). The second temperature condition may correspond to, for example, (i) a determination of the temperature on the solar panel as a result of the current reduction, or (ii) a determination of the change in temperature as a result of the current reduction. For example, if the difference between the current temperature of the solar panel and its previous measurement is greater than some threshold, then the current reduction may be continued (or performed again). However, in many instances, temperature reduction ceases after one or more iterations of current reduction. At such point, some embodiments may cease current reduction (360).

The voltage and current can be detected again (350) to determine whether the power level of the solar panels output is at or within the designated percentage of the maximum level. If the power level has dropped, current reduction may be stopped (360) or even reversed. However, if the power level has not significantly dropped (e.g. so that it is within the designated percentage of the maximum), then current reduction may be performed again (assuming temperature condition 345 remains true).

While embodiments such as described with FIG. 3 and FIG. 4 use temperature input as a trigger, other embodiments may incorporate other triggers or input to initiate current and temperature reduction. For example, with reference to FIG. 3, control module 100 may receive input from a clock 205. The clock 205 may indicate temperature by correlation with time of day. For example, as an alternative to temperature detection, clock 205 may trigger the control module 100 to implement current reduction during a particular period of the day. Optionally, information from the clock 205 can be cross-referenced with time of year and/or geographic location.

As another variation, other sources of information may include for example of a data port (not shown) which communicates environmental temperature to the control module 100.

Still further, the control module 100 may be operated under the remote and programmatic command of a larger system, such as provided by a service. In such embodiments, the control module 100 may include a data port for receiving communications from a remote service.

The following provides a simplified example of the operation of a control system or module, in accordance with embodiments described herein:

Operating Temperature: 25 degrees C.

For a 80 W PV panel, typically, $V_{OC}$=22 V, $I_{SC}$=7.6 Amps. The MPP at room temperature is typically is $V_{MPP}$=17 V (Voltage at MPP), $I_{MPP}$=6.0 A (Current at MPP), Power at MPP: 17*6=102 W.

At panel temperature Temp=55 degrees C., and without temperature compensation, the expected measurements are $V_{OC}$=19.4 V, $V_{MPP}$=13.4 V, $I_{SC}$=7.6 Amp and $I_{MPP}$=6.01 Amp.

With temperature compensation (e.g. by current reduction), at Temp=55 degrees C., by forcing $I_{MPP}$ (Current at MPP) to 5.0 Amp, $V_{MPP}$ (Voltage at MPP) will boost to 15.6 V to produce the same amount of power. As an example, due to reduction in current, power lost in $R_{SH}$ is reduced, thus reducing temperature by up to 12 degrees C. depending on the thermal resistance of the mounting.

CONCLUSION

Although illustrative embodiments of the invention have been described in detail herein with reference to the accompanying drawings, it is to be understood that the invention is not limited to those precise embodiments. As such, many modifications and variations will be apparent to practitioners skilled in this art. Accordingly, it is intended that the scope of the invention be defined by the following claims and their equivalents. Furthermore, it is contemplated that a particular feature described either individually or as part of an embodiment can be combined with other individually described features, or parts of other embodiments, even if the other features and embodiments make no mentioned of the particular feature. This, the absence of describing combinations should not preclude the inventor from claiming rights to such combinations.

What is claimed is:

1. A control system for a solar panel, the control system comprising:
   an input source to provide an input that is indicative of a temperature of the solar panel; and
   a control module that is coupled to the input source and the solar panel, the control module to:
      determine that the temperature of the solar panel is above a threshold temperature based on the input from the input source;
      in response to determining that the temperature of the solar panel is above the threshold temperature, use a maximum power point tracker algorithm that measures a maximum power level of the solar panel to (i) determine whether an output of the solar panel is within a designated percentage or fixed range of the maximum power level, and (ii) in response to determining that the output of the solar panel is within the designated percentage or fixed range of the maximum power level, decrease a current level of the solar panel's output while maintaining the output of the solar panel within the designated percentage or fixed range of the maximum power level.

2. The control system of claim 1, further comprising:
a switching element that is coupled to the solar panel and the control module, the switching element to affect the solar panel's output; and
wherein the control module affects operation of the switching element by providing a control signal to the switching element in order to decrease the current level of the solar panel's output.

3. The control system of claim 1, wherein the input source includes a sensor that detects a temperature level of the solar panel.

4. The control system of claim 1, wherein the input source includes a clock that indicates a time of day.

5. The control system of claim 1, wherein the control module is structured to iteratively decrease the current level of the solar panel's output by (i) decreasing the current level when the solar panel output is within the designated percentage or fixed range of the maximum level, then (ii) determining (a) a current power output of the solar panel after the current is decreased, and (b) a current temperature level of the solar panel after the current is decreased, and (iii) decreasing the current level again only if (a) the current power output of the solar panel is within the designated percentage or fixed range of the maximum level, and (b) the current temperature satisfies a designated condition.

6. The control system of claim 5, wherein the current temperature satisfies the designated condition if it is above a lower threshold temperature.

7. The control system of claim 5, wherein the current temperature satisfies the designated condition if the difference between the current temperature level and a prior temperature level is greater than a designated threshold.

8. The control system of claim 1, further comprising:
an interface to receive environmental temperature information from a remote source.

9. The control system of claim 1, further comprising:
one or more detectors that detect the power level of the solar panel's output.

10. A method for controlling an output of a solar panel, the method comprising:
measuring a temperature of the solar panel;
determining that the temperature of the solar panel is above a threshold temperature; and
in response to determining that the temperature of the solar panel is above the threshold temperature, using a maximum power point tracker algorithm that measures a maximum power level of the solar panel to (i) determine whether an output of the solar panel is within a designated percentage or fixed range of the maximum power level, and (ii) in response to determining that the output of the solar panel is within the designated percentage or fixed range of the maximum power level, reducing a current level of the output of the solar panel while maintaining the output of the solar panel within the designated percentage or fixed range of the maximum power level.

11. The method of claim 10, further comprising:
in response to reducing the current level of the output of the solar panel, measuring the temperature of the solar panel to determine whether to reduce the current level of the output of the solar panel a subsequent time.

12. The method of claim 10, wherein reducing the current level of the output of the solar panel includes causing a switching speed of a switching element coupled to the solar panel to be changed.

13. A solar power system comprising:
a solar panel;
a load; and
a control system coupled to the solar panel and the load, the control system comprising:
a temperature sensor to provide an input that is indicative of a temperature of the solar panel; and
a control module that is coupled to the temperature sensor and the solar panel, the control module to:
determine that the temperature of the solar panel is above a threshold temperature based on the input from the temperature sensor; and
in response to determining that the temperature of the solar panel is above the threshold temperature, use a maximum power point tracker algorithm that measures a maximum power level of the solar panel to (i) determine whether an output of the solar panel is within a designated percentage or fixed range of the maximum power level, and (ii) in response to determining that the output of the solar panel is within the designated percentage or fixed range of the maximum power level, decrease a current level of the solar panel's output while maintaining the output of the solar panel within the designated percentage or fixed range of the maximum power level.

14. The solar power system of claim 13, wherein the control system further comprises a switching element that is coupled to the solar panel and the control module, the switching element to affect the solar panel's output, and wherein the control module affects operation of the switching element by providing a control signal to the switching element in order to decrease the current level of the solar panel's output.

15. The solar power system of claim 14, wherein the control signal includes a pulse width modulus signal to change a switching speed of the switching element.

* * * * *